(12) United States Patent
Chen et al.

(10) Patent No.: US 7,545,006 B2
(45) Date of Patent: Jun. 9, 2009

(54) CMOS DEVICES WITH GRADED SILICIDE REGIONS

(75) Inventors: Hung-Ming Chen, Hsinchu (TW);
Chien-Chao Huang, Hsin-Chu (TW);
Fu-Liang Yang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 183 days.

(21) Appl. No.: 11/496,857

(22) Filed: Aug. 1, 2006

(65) Prior Publication Data

US 2008/0029831 A1 Feb. 7, 2008

(51) Int. Cl.
*H01L 29/76* (2006.01)
(52) U.S. Cl. .................................. 257/382; 257/408
(58) Field of Classification Search ......... 257/382–384, 257/408
See application file for complete search history.

(56) References Cited

U.S. PATENT DOCUMENTS 6,548,877 B2 * 4/2003 Yang et al. ................. 257/382
7,309,901 B2 * 12/2007 Chen et al. ................. 257/413
7,423,283 B1 * 9/2008 Luo et al. ..................... 257/19
2006/0255413 A1 * 11/2006 Oh et al. ..................... 257/382

OTHER PUBLICATIONS

Yoshitomi, T., et al., "High Performance of Silicided Silicon-Sidewall Source and Drain($S^4D$) Structure," IEEE Transactions on Electron Devices, vol. 45, No. 6, Jun. 1998, pp. 1295-1299.

* cited by examiner

*Primary Examiner*—Mark Prenty
(74) *Attorney, Agent, or Firm*—Slater & Matsil, L.L.P.

(57) ABSTRACT

A semiconductor device includes a semiconductor substrate, a gate stack overlying the semiconductor substrate, a spacer on a sidewall of the gate stack, a lightly doped source/drain (LDD) region adjacent the gate stack, a deep source/drain region adjoining the LDD region, and a graded silicide region on the deep source/drain region and the LDD region. The graded silicide region includes a first portion having a first thickness and a second portion adjoining the first portion and having a second thickness substantially less than the first thickness. The second portion is closer to a channel region than the first portion.

19 Claims, 8 Drawing Sheets

US 7,545,006 B2

CMOS DEVICES WITH GRADED SILICIDE REGIONS

TECHNICAL FIELD

This invention relates generally to the structure and manufacturing methods of metal-oxide-semiconductor (MOS) devices, and more particularly to the formation of silicide regions of MOS devices.

BACKGROUND

Deep-submicron scaling required for VLSI systems dominates design considerations in the microelectronics industry. As gate electrode length is scaled down, the source and drain junctions must be scaled down accordingly to suppress the so-called short channel effects (SCE) that degrade the performance of miniaturized devices. A major problem related to complementary metal oxide silicon (CMOS) scaling is the undesirable increase in parasitic resistance. As the source/drain junction depth and polycrystalline silicon line width are scaled into the deep-submicron range, contact resistance becomes more significant and needs to be reduced.

The principle way of reducing contact resistances between polysilicon gates and source/drain regions and interconnect lines is by forming metal silicides atop the source/drain regions and the gate electrodes prior to application of the conductive film for formation of the various conductive interconnect lines. Silicide regions are typically formed using a salicide (self-aligned silicide) process. In the salicide process, a thin layer of metal is blanket deposited over the semiconductor substrate, specifically over exposed source/drain and gate electrode regions. The wafer is then subjected to one or more annealing steps. This annealing process causes the metal to selectively react with the exposed silicon of the source/drain regions and the gate electrodes, thereby forming a metal silicide. The process is referred to as a self-aligned silicidation process because the silicide layer is formed only where the metal material directly contacts the silicon source/drain regions and the polycrystalline silicon (polysilicon) gate electrode. Following the formation of the silicide layer, the un-reacted metal is removed and an interconnect process is performed to provide conductive paths, such as by forming via holes through a deposited interlayer dielectric and filling the via holes with a conductive material, e.g., tungsten.

The conventional silicidation process, however, suffers drawbacks when the integrated circuit formation technology evolves to 65 nm and below. An example of the problem is illustrated in FIG. 1, which includes slim spacers 2 that are widely used for lowering sheet resistance in LDD regions and for applying greater stress to the channel region. The formation process for the MOS device shown in FIG. 1 includes forming LDD regions 6, forming thick spacers, forming deep source/drain regions 8, and thinning the thick spacers to form slim spacers 2. Silicide regions 4 are then formed aligned with the slim spacers 2. Such a process may result in silicide regions 4 intruding into LDD regions 6. In 65 nm technology and below, LDD regions 6 are shallow, for example, with a depth of 100 Å to about 150 Å. Typical silicide regions, however, have a thickness of about 170 Å, which is greater than the depth of LDD regions 6. Silicide regions 4 thus punch through the junctions between the respective LDD regions and the substrate, resulting in significant leakage current.

Accordingly, what is needed in the art is a new method and structure that may incorporate silicides to take advantage of the benefits associated with reduced resistivity while at the same time overcoming the deficiencies of the prior art.

SUMMARY OF THE INVENTION

In accordance with one aspect of the present invention, a semiconductor device includes a semiconductor substrate, a gate stack overlying the semiconductor substrate, a spacer on a sidewall of the gate stack, a lightly doped source/drain (LDD) region adjacent the gate stack, a source/drain region adjoining the LDD region, and a graded silicide region on the source/drain region and the LDD region. The graded silicide region includes a first portion having a first thickness, and a second portion adjoining the first portion and having a second thickness substantially less than the first thickness. The second portion is closer than the first portion to a channel region.

In accordance with another aspect of the present invention, a semiconductor device includes a semiconductor substrate, a gate stack overlying the semiconductor substrate, a spacer having a thickness less than about 200 Å on a sidewall of the gate stack, a lightly doped source/drain (LDD) region adjacent the gate stack, a source/drain region adjoining the LDD region, a first silicide region on the source/drain region, and a second silicide region between the first silicide region and the spacer, wherein the first silicide region has a first thickness greater than a second thickness of the second silicide region.

In accordance with yet another aspect of the present invention, a method for forming a semiconductor structure includes providing a semiconductor substrate, forming a gate stack overlying the semiconductor substrate, forming a spacer on a sidewall of the gate stack, forming a lightly doped source/drain (LDD) region adjacent the gate stack, forming a source/drain region adjoining the LDD region, forming a first silicide region on the source/drain region, and forming a second silicide region between the first silicide region and the spacer, wherein the first silicide region has a first thickness greater than a second thickness of the second silicide region.

In accordance with yet another aspect of the present invention, a method for forming a semiconductor device includes providing a semiconductor substrate, forming a gate stack overlying the semiconductor substrate, forming a lightly doped source/drain (LDD) region adjacent the gate stack, forming a spacer on a sidewall of the gate stack, forming a source/drain region, thinning the spacer to form a spacer to a thickness of less than about 200 Å, forming a disposable spacer on a sidewall of the spacer, forming a first metal layer on exposed portions of the LDD region and exposed portions of the source/drain region after the steps of forming the disposable spacer, siliciding the first metal layer to form a first silicide region, removing the disposable spacer, forming a second metal layer on at least the exposed portions of the LDD region and the exposed portions of the source/drain region, and siliciding the second metal layer to form a second silicide region, wherein the first silicide region has a first thickness greater than a second thickness of the second silicide region.

In accordance with yet another aspect of the present invention, a method for forming a semiconductor device includes providing a semiconductor substrate, forming a gate stack overlying the semiconductor substrate, forming a spacer having a thickness of less than about 200 Å on a sidewall of the gate stack, raising exposed portions of the semiconductor substrate adjacent the spacer, forming a lightly doped source/drain (LDD) region adjacent the gate stack, forming a disposable spacer on a sidewall of the spacer, forming a source/drain region, forming a first metal layer on exposed portions of the LDD region and exposed portions of the source/drain region, siliciding the first metal layer to form a first silicide region, removing the disposable spacer, forming a second metal layer on at least the exposed portions of the LDD region and the exposed portions of the source/drain region, and siliciding the second metal layer to form a second silicide region, wherein the first silicide region has a first thickness greater than a second thickness of the second silicide region.

The MOS devices formed using the preferred embodiments of the present invention have a reduced leakage current and an improved sheet resistance in the LDD regions.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A semiconductor device formed using a novel silicide formation process is discussed in subsequent paragraphs. The intermediate stages of manufacturing preferred embodiments of the present invention are illustrated. Throughout the various views and illustrative embodiments of the present invention, like reference numbers are used to designate like elements.

Figure 1:
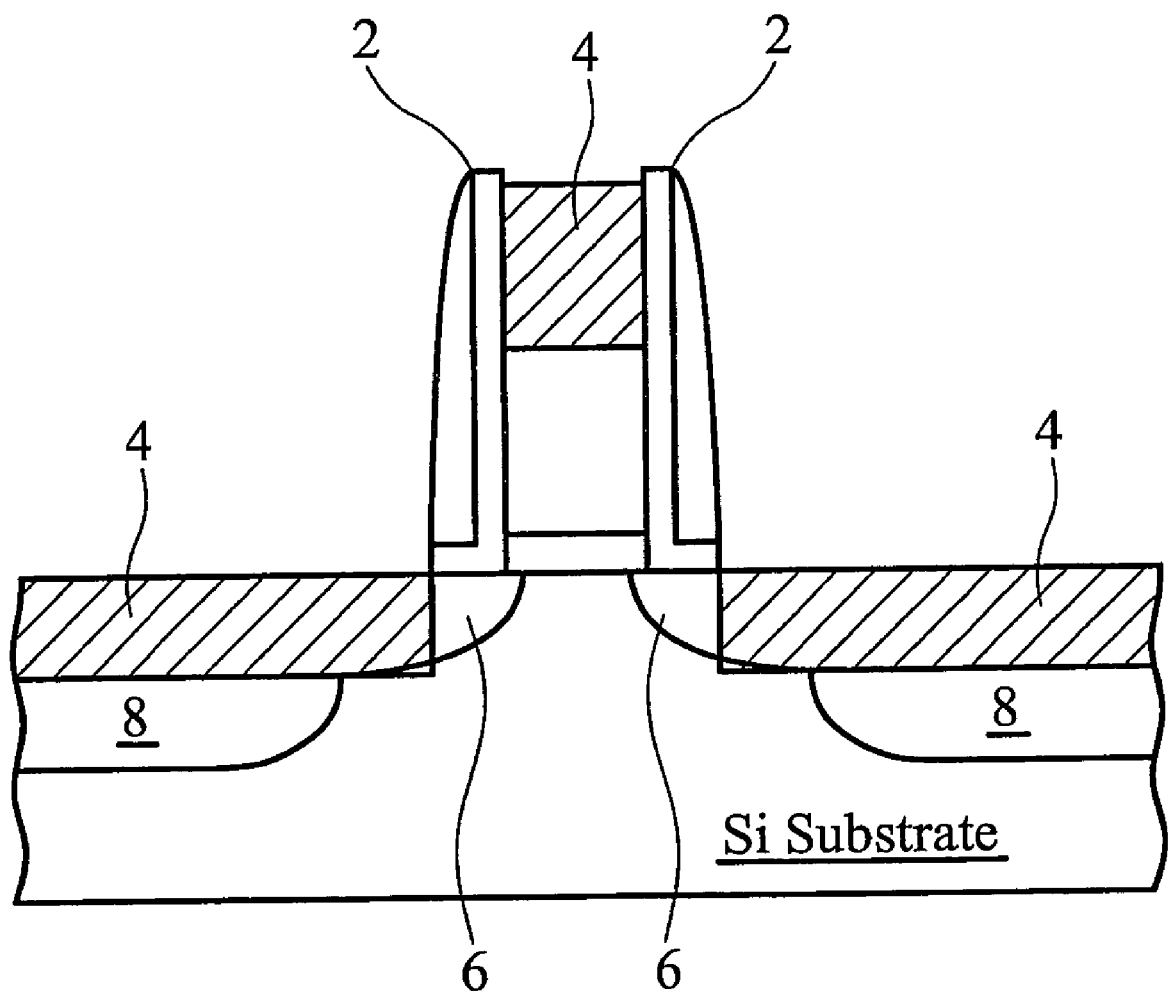
FIG. 1 illustrates a MOS device formed using small-scale technology and a conventional silicide formation process, wherein the silicide regions extend into the substrate, and wherein the source/drain regions are not raised.
Figure 2:
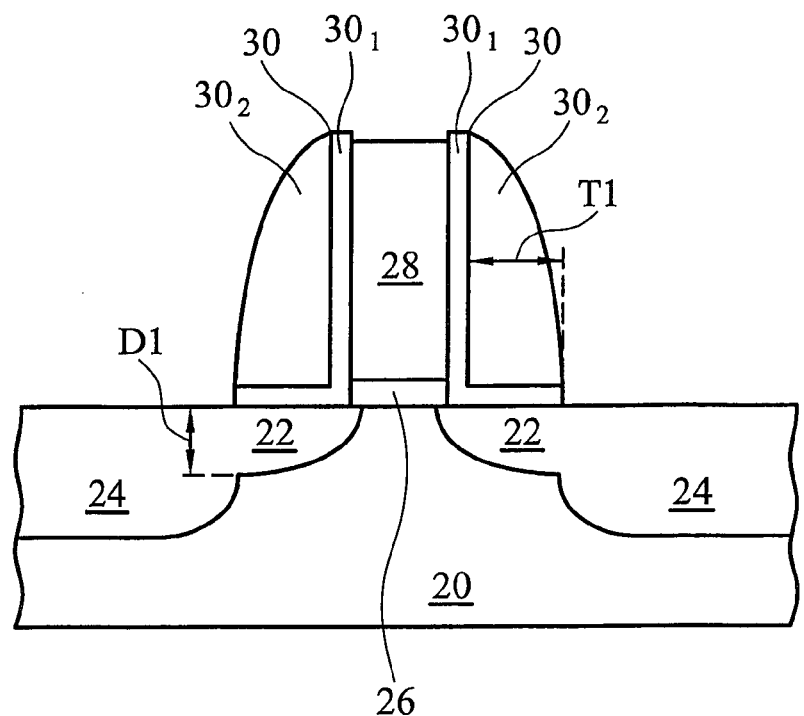
FIGS. 2 through 8 are cross-sectional views of intermediate stages in the manufacture of a first preferred embodiment, wherein graded silicide regions are formed.

FIG. 2 illustrates a portion of a metal-oxide-semiconductor (MOS) device, which includes a gate dielectric 26, a gate electrode 28, lightly-doped drain/source (LDD) regions 22, deep source/drain regions 24, and gate spacers 30. In the preferred embodiment, substrate 20 is a silicon substrate. In other embodiments, SiGe, bulk semiconductor, strained semiconductor, compound semiconductor, silicon on insulator (SOI), and other commonly used semiconductor materials can be used.

As is known in the art, gate dielectric 26 may include silicon oxide or high-k dielectric materials such as oxynitride, oxygen-containing dielectric, nitrogen-containing dielectric, and combinations thereof. In the preferred embodiment, gate electrode 28 comprises polysilicon. The preferred formation methods include chemical vapor deposition (CVD) methods. Gate electrode 28 is preferably doped to reduce sheet resistance. In other embodiments, gate electrode 28 comprises amorphous silicon or metal. As is known in the art, gate electrode 28 and gate dielectric 26 are preferably formed by depositing a gate dielectric layer on substrate 20 and depositing a gate electrode layer on the gate dielectric layer. The gate dielectric layer and the gate electrode layer are then patterned, forming gate dielectric 26 and gate electrode 28, respectively. Lightly doped source/drain (LDD) regions 22 are then formed, preferably by implanting appropriate impurities using the gate stack as a mask. In 65 nm technology, LDD regions 22 have a depth D1 of about 100 Å to about 150 Å. Throughout the description, the dimensions referred to are exemplary dimensions for 65 nm technology. One skilled in the art will realize that the dimensions referred to in the specification will change with the integrated circuit.

A pair of spacers 30 is formed along sidewalls of gate dielectric 26 and gate electrode 28. As is known in the art, spacers 30 are preferably formed by blanket depositing one or more dielectric layers, then anisotropically etching to remove dielectric material from horizontal surfaces of substrate 20. Spacers 30 may be formed of a single dielectric layer or of a composite layer including more than one dielectric layer. In the preferred embodiment, spacers 30 include a silicon nitride portion $30_2$ on a silicon oxide liner $30_1$. Spacers 30 preferably have a thickness T1 of about 350 Å to about 420 Å, and more preferably between about 370 Å and about 400 Å.

FIG. 2 also illustrates the formation of deep source/drain regions 24. In the preferred embodiment, deep source/drain regions 24 are formed by implanting impurities into semiconductor substrate 20. Spacers 30 and the gate stack are used as a mask for the subsequent source/drain implantation process. In other embodiments, deep source/drain regions 24 are formed by recessing substrate 20 and epitaxially growing semiconductor materials, such as silicon, germanium, carbon, and combinations thereof, in the recesses. The desired impurities may be doped simultaneously with the epitaxial growth or may be implanted after the epitaxial growth.

Figure 3:
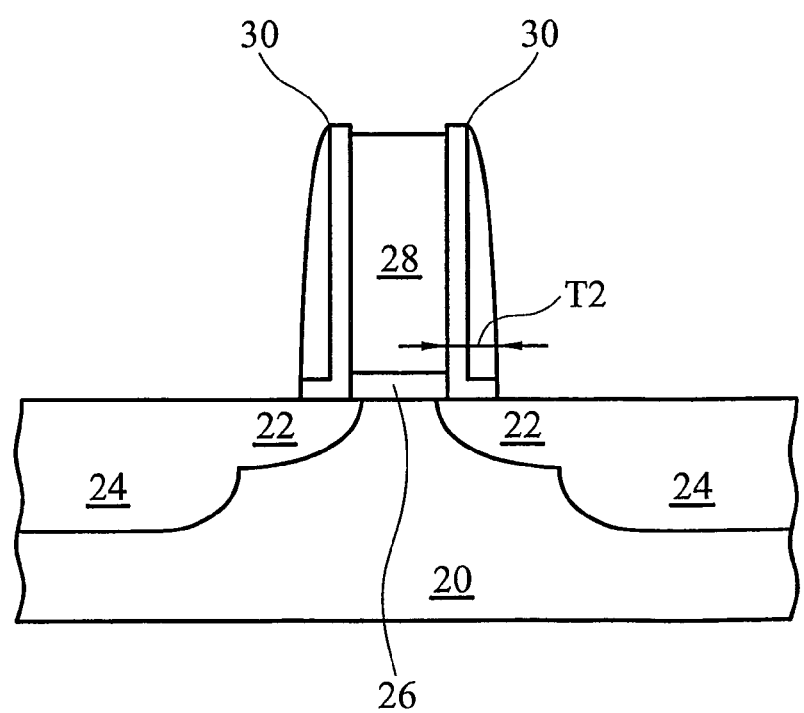

Referring to FIG. 3, spacers 30 are thinned. In the preferred embodiment wherein spacers 30 include silicon nitride portions $30_2$ on oxide liners $30_1$, silicon nitride portions $30_2$ are thinned by wet etching using phosphoric acid. HF acid is then used to remove the exposed portions of oxide liner $30_1$. The resulting slim spacers 30 have a thickness T2 substantially less than the thickness T1 (refer to FIG. 2) before the thinning. In an exemplary embodiment, T2 is less than about 50 percent of T1. In 65 nm technology, thickness T2 is preferably between about 150 Å and about 200 Å.

Figure 4:
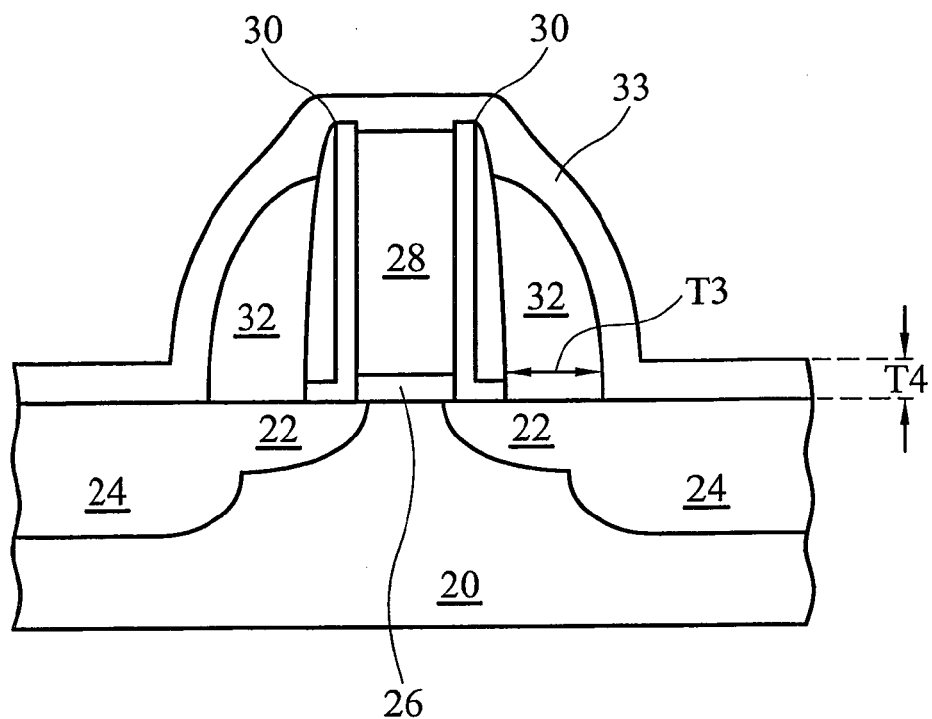

In FIG. 4, disposable spacers 32, which are preferably formed of a material having etching characteristics different from spacers 30, and at least different from the spacer portions $30_2$, are formed. In an exemplary embodiment, disposable spacers 32 include oxides such as silicon oxide. The thickness T3 is preferably between about 200 Å and about 250 Å. More preferably, the outer edges of disposable spacers 32 extend beyond the respective interfaces of LDD regions 22 and source/drain regions 24.

A metal layer 33 is then blanket deposited. Metal layer 33 preferably comprises nickel. However, it may also comprise other metals such as cobalt, platinum, and combinations thereof. Metal layer 33 preferably has a thickness T4 of between about 90 Å and about 110 Å, and more preferably about 100 Å. In the preferred embodiment, physical vapor deposition (PVD) is used for forming metal layer 33, although other commonly used methods, such as sputtering, low pressure CVD (LPCVD), and atomic layer chemical vapor deposition (ALD), can also be used. In alternative embodiments, electroless plating, which can selectively form a metal layer on source/drain regions 24, but not on dielectrics such as gate spacers 30, is used for forming metal layer 33.

Figure 5:
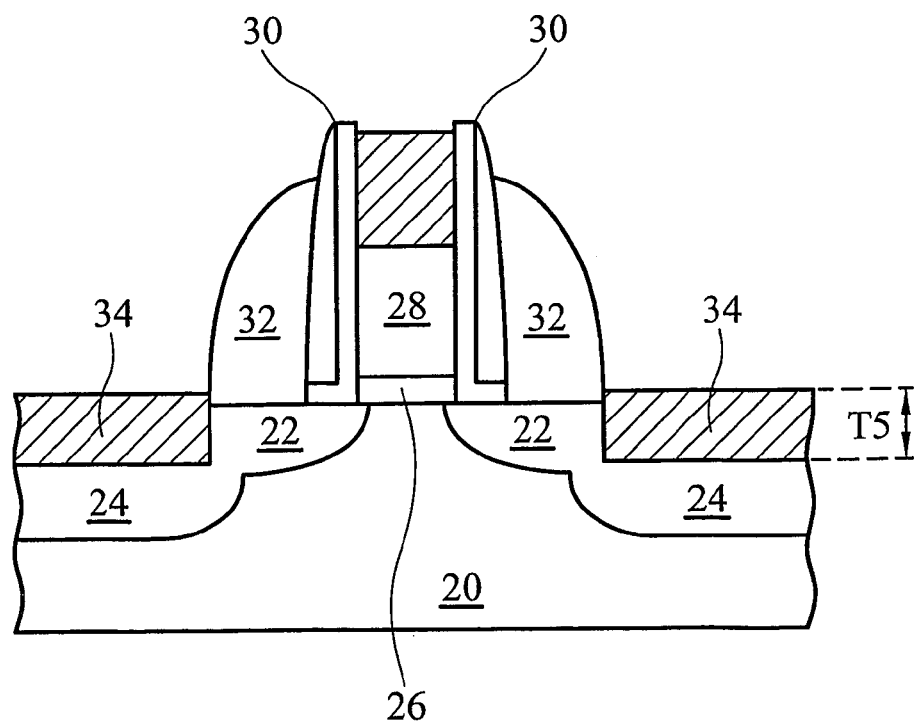

An annealing process is then performed, forming source/drain silicide regions 34, and the resulting structure is shown in FIG. 5. The annealing process is preferably performed at a temperature of about 350° C. or lower, although a lower temperature is always desirable, providing the quality of the resulting silicide regions is not compromised. As is known in the art, the annealing process may be performed using thermal annealing, flash annealing, laser annealing, and the like. Preferably, the annealing process comprises two steps. The first step includes a first annealing at a relatively low temperature (referred to as Temp1 hereinafter). In the first step, at least a portion of metal layer 33 reacts with silicon to form a silicide. This silicide typically has a higher resistivity than desired. Un-reacted metal is then removed. The second step includes a second annealing to convert the high-resistivity silicide to a low-resistivity silicide. The second annealing is typically performed at a higher temperature (referred to as Temp2 hereinafter) than the first temperature Temp1. In an exemplary embodiment for forming silicide regions 34, the first temperature Temp1 is about 300° C., while the second temperature Temp2 is about 400° C. The first annealing time is preferably between about 50 seconds and about 80 seconds. In an exemplary embodiment, the first annealing time is about 60 seconds. The resulting source/drain silicide regions 34 preferably have a thickness T5 of between about 150 Å and about 190 Å, and more preferably about 170 Å. Thickness T5 of source/drain silicide regions 34 is likely to be substantially close to, or even greater than, a depth D1 of LDD regions 22 (refer to FIG. 2).

Figure 6:
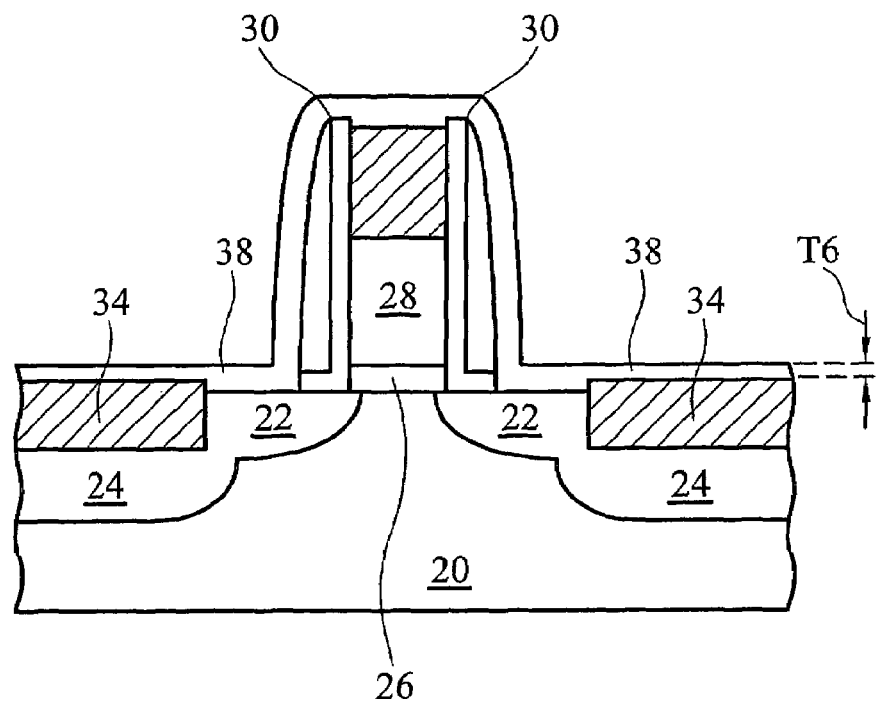

Referring to FIG. 6, disposable spacers 32 are removed, for example, using HF acid. A metal layer 38 is then formed. Metal layer 38 has a thickness T6, which is preferably less than thickness T4 of metal layer 33 (refer to FIG. 4). In the preferred embodiment, thickness T6 is between about 25 Å and about 50 Å, and is more preferably about 30 Å. Also, thickness T6 is preferably less than about 70 percent of the thickness T4. The preferred metals in metal layer 38 include nickel, cobalt, platinum, and combinations thereof. Metal layer 38 may be formed of a same material as metal layer 33. Alternatively, they may include different materials.

Figure 7:
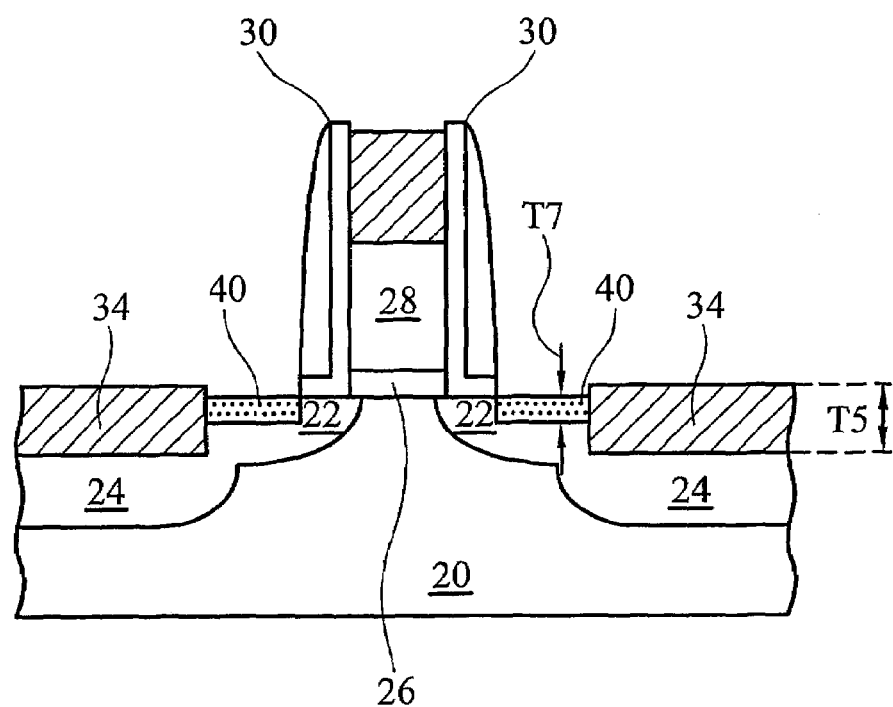
Figure 8:
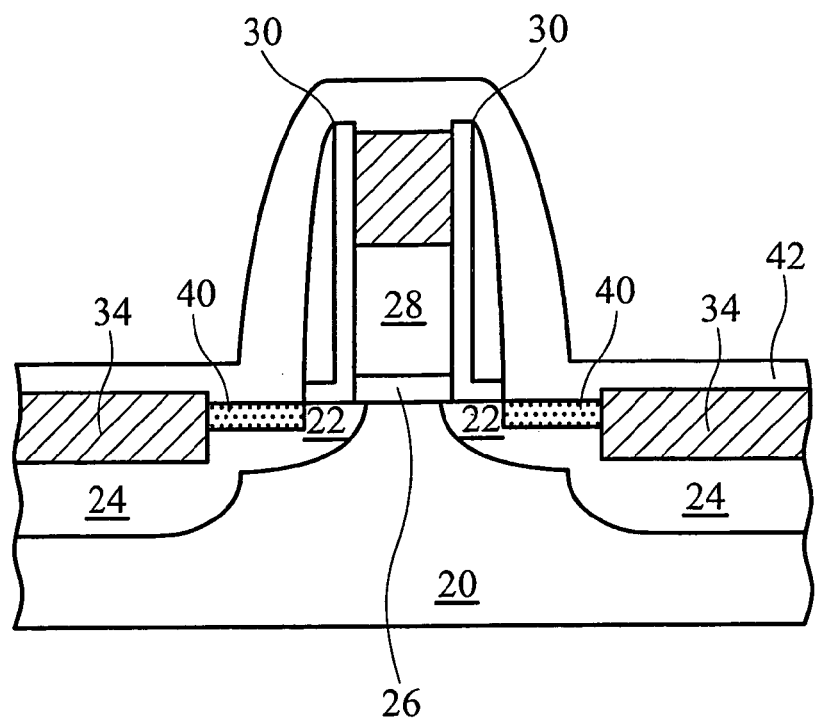

An annealing process is then performed, and thin silicide regions 40 are formed, as shown in FIG. 7. Preferably, the annealing process also includes a first annealing at a temperature Temp3, and a second annealing at a temperature Temp4. Preferably, the first annealing temperature Temp3 is less than the first annealing temperature Temp1 for forming silicide regions 34. In an exemplary embodiment, the temperature difference is between about 10° C. and about 40° C., and more preferably about 20° C. In addition, the annealing time of the first annealing is preferably less than the first annealing time for forming silicide regions 34. In an exemplary embodiment, the first annealing time for forming the thin silicide regions 40 is about 30 seconds. With a thinner metal layer 38, a lower annealing temperature Temp3, and/or a shorter annealing time, thickness T7 of thin silicide regions 40 is less than thickness T5 of silicide regions 34. Preferably, thickness T7 is less than about 65 percent of the thickness T5. The preferred thickness T7 is less than about 100 Å, and more preferably about 60 Å.

Preferably, the second annealing for forming thin silicide regions 40 are performed at a temperature Temp4 and/or a duration essentially the same as the second annealing temperature Temp2 and the duration for forming silicide regions 34. In alternative embodiments, the second annealing for silicide regions 34 is skipped. The high-resistive silicide regions 34 will be turned into low-resistive silicide regions 34 during the second annealing for thin silicide regions 40.

Next, a contact etch stop layer (CESL) 42 is blanket formed. Besides performing the etch stop function, CESL 42 also applies a stress to the channel regions of the respective MOS devices. For a PMOS device, CESL 42 has an inherent compressive stress, and thus applies a compressive stress to the channel region. For an NMOS device, CESL 42 has an inherent tensile stress, and thus applies a tensile stress to the channel region. With slim spacers 30, greater stresses can be applied by CESL 42.

In the embodiment discussed in the preceding paragraphs, the source/drain regions are not raised. For integrated circuits having scales less than 65 nm, raised source/drain regions are preferred. The process flow of a second embodiment, which illustrates a preferred embodiment having raised source/drain regions, is illustrated in FIGS. 9 through 15. Again, like reference numerals are used for indicating like elements in the first embodiment. Unless specifically discussed, the corresponding dimensions, preferred materials, formation steps and process conditions are essentially the same as in the first embodiment.

Figure 9:
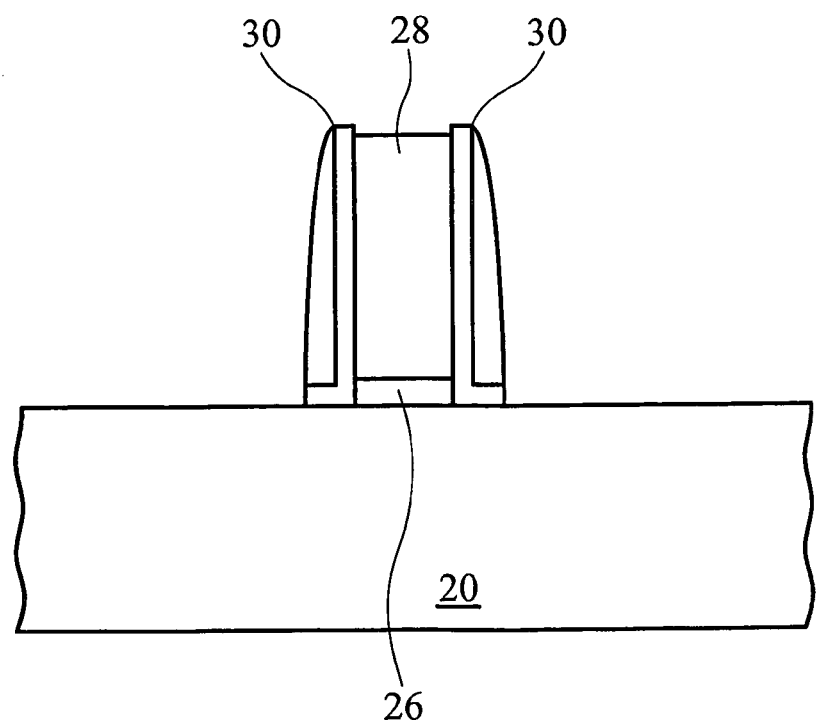
FIGS. 9 through 15 are cross-sectional views of intermediate stages in the manufacture of a second preferred embodiment, wherein the graded silicide regions are formed after the source/drain regions are raised.

Referring to FIG. 9, a substrate 20 is provided. A gate stack, including a gate dielectric 26 and a gate electrode 28, is formed on substrate 20. Slim spacers 30, which preferably have same dimensions and materials as in the first embodiment (refer to FIG. 3), are then formed. Slim spacers 30 may be formed either by forming a thin silicon nitride layer on a thin oxide liner layer and then patterning the stacked layers, or by forming thick spacers as illustrated in FIG. 2, and then thinning the thick spacers.

Figure 10:
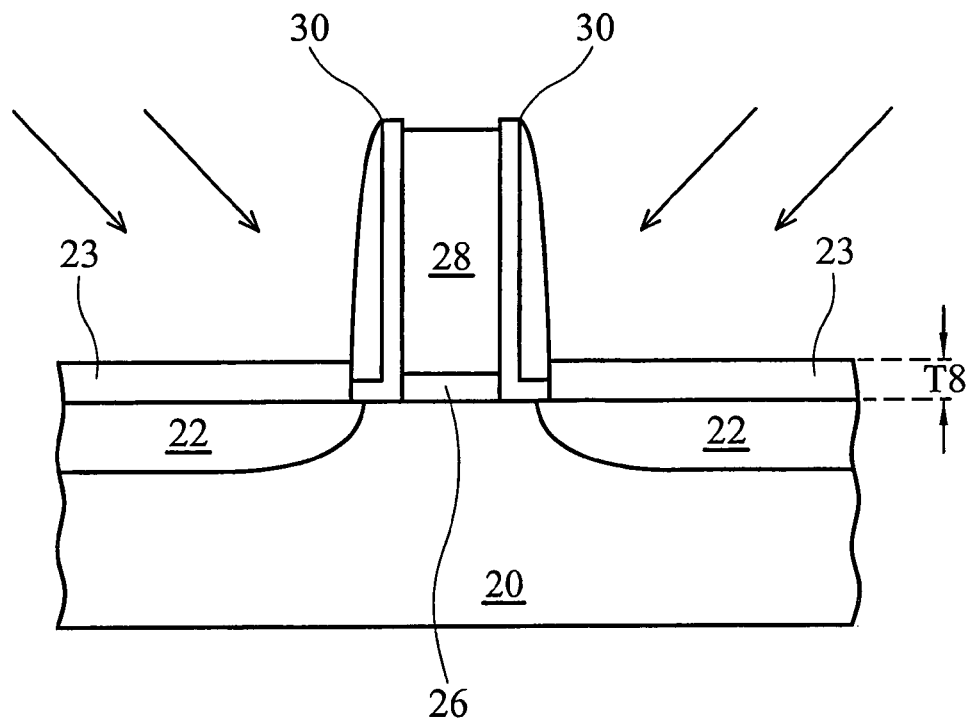

FIG. 10 illustrates the formation of a semiconductor layer 23, preferably by epitaxial growth. Semiconductor layer 23 preferably has a thickness of between about 100 Å and about 250 Å, although the preferred thickness is related to the scale for forming the integrated circuit. LDD regions 22 are then formed, preferably by implanting appropriate impurities. As LDD regions 22 are formed after the formation of slim spacers 30, LDD regions 22 are preferably slant implanted, so that LDD regions 22 extend further into the channel region than the outer edges of slim spacers 30. Alternatively, LDD regions 22 are formed prior to the formation of semiconductor layer 23.

Figure 11:
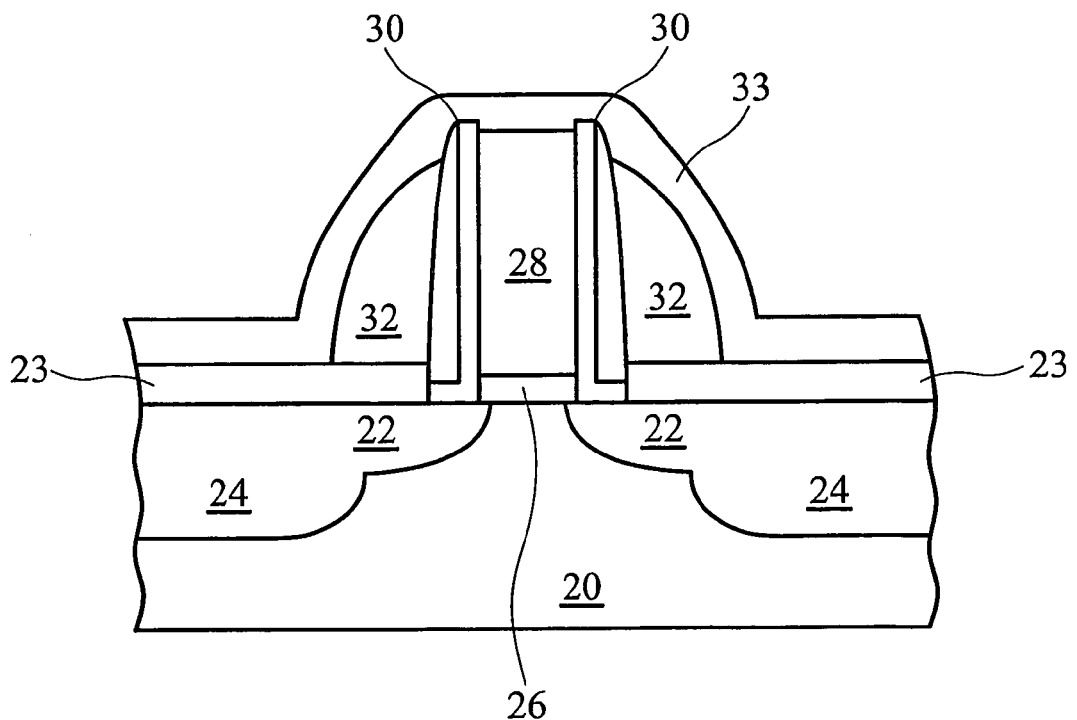

In FIG. 11, disposable spacers 32 are formed, which preferably comprise a different material than slim spacers 30. An implantation is then performed to form deep source/drain regions 24. Accordingly, deep source/drain regions 24 are substantially aligned to the respective edges of disposable spacers 32. A metal layer 33 is then blanket formed.

Figure 12:
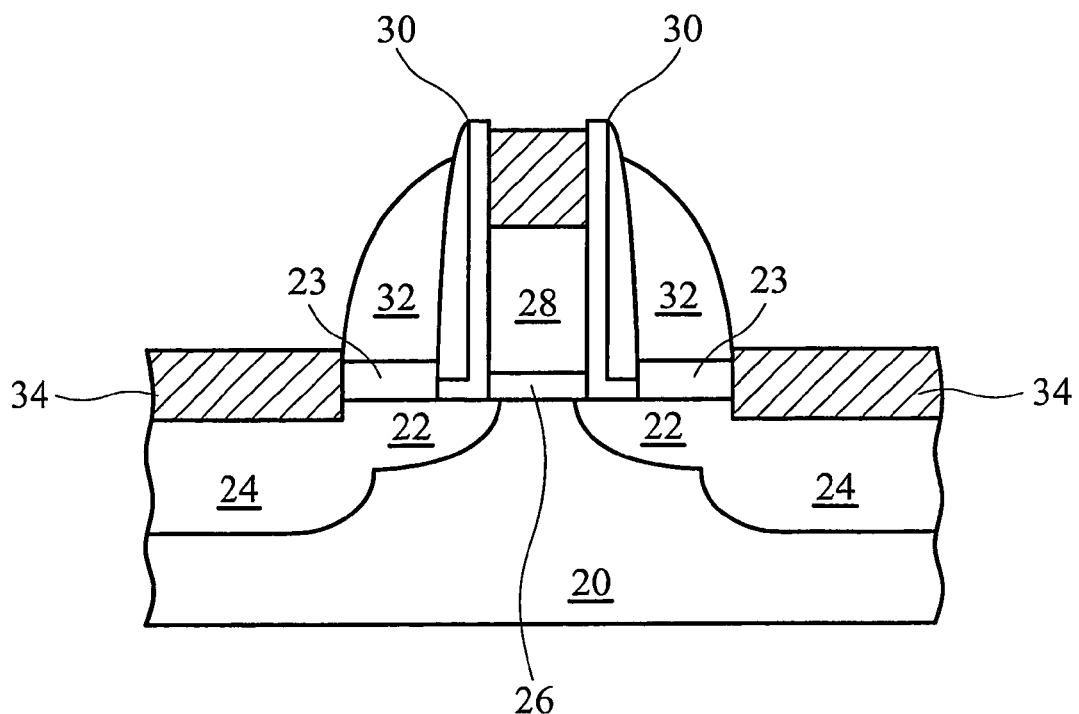

FIG. 12 illustrates the formation of thick silicide regions 34, which are substantially aligned to the respective edges of the disposable spacers 32. Similar to the first embodiment, the formation of the thick silicide regions 34 includes forming a metal layer, performing a first annealing to form silicides, removing un-reacted metal, and performing a second annealing. Alternatively, the second annealing is skipped.

Figure 13:
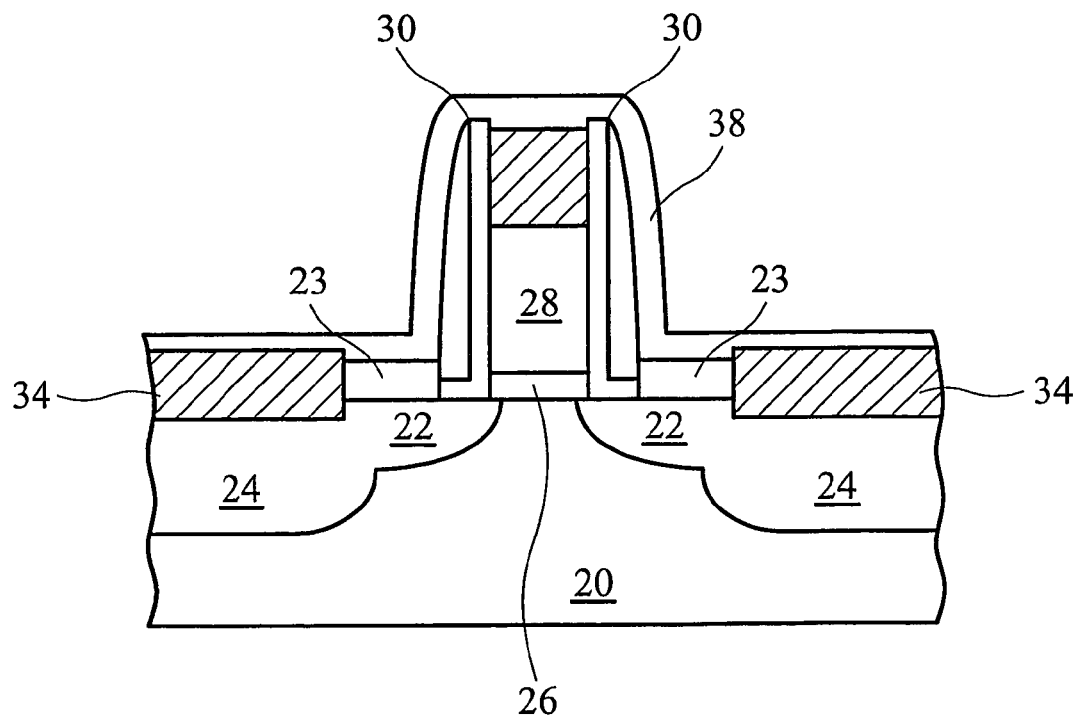
Figure 14:
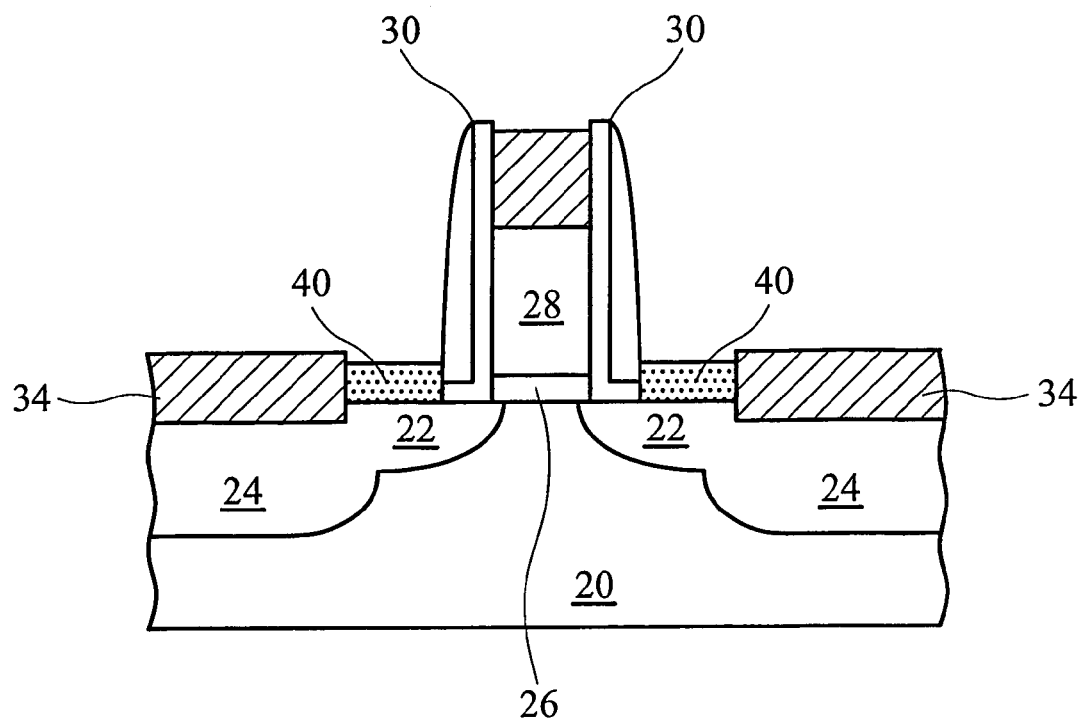
Figure 15:
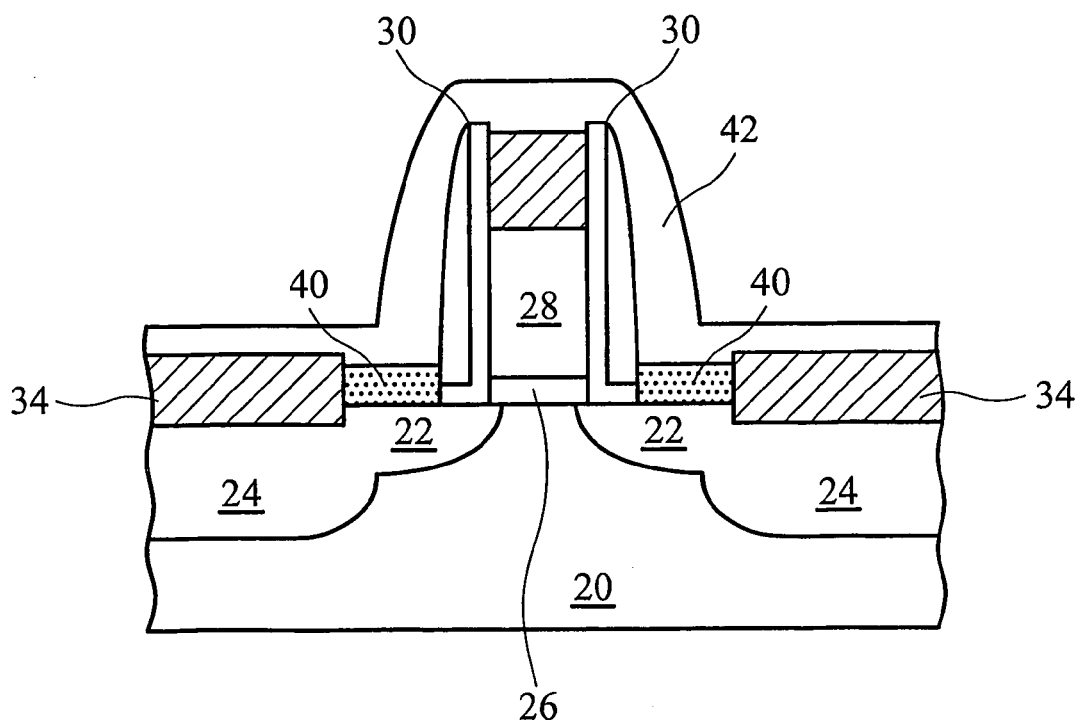

Referring to FIG. 13, disposable spacers 32 are removed, and a metal layer 38, which is preferably thinner than metal layer 33 (refer to FIG. 11), is blanket formed. A first annealing is then performed. Preferably, the first annealing has a lower temperature and/or a shorter duration than the respective temperature and duration of the first annealing for forming thick silicide regions 34. The resulting thin silicide regions 40, as illustrated in FIG. 14, are thinner than thick silicide regions 34. The bottom surface of thin silicide regions 40 may be substantially higher, lower or the same height as the top surface of substrate 20. The second annealing for forming thin silicide regions 40 preferably has the same process conditions as the second annealing for forming thick silicide regions 34. A CESL 42 is then formed, as illustrated in FIG. 15.

Silicide regions 34 and 40 form graded silicides. Thinner silicide regions 40 may extend further into LDD regions 22. As a result, the resistance in the LDD regions is improved. Since the thin silicide regions 40 have a depth less than the depth of LDD regions 22, there is no risk that the silicide regions might penetrate the junction and cause high leakage currents.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
  a semiconductor substrate;
  a gate stack overlying the semiconductor substrate;
  a lightly doped source/drain (LDD) region adjacent the gate stack;
  a deep source/drain region adjoining the LDD region;
  a graded silicide region on the deep source/drain region and the LDD region, wherein the graded silicide region comprises a first portion having a first thickness, a second portion adjoining the first portion and having a second thickness substantially less than the first thickness, and wherein the second portion is closer to a channel region than the first portion;
  a spacer on a sidewall of the gate stack, wherein the spacer is a slim spacer having a thickness of less than about 200 Å, wherein the spacer is free from portions directly over the second portion of the graded silicide region, and wherein an inner edge of the second portion adjoins an outer edge of the spacer; and
  a contact etch stop layer (CESL) over the gate stack, the spacer, and the graded silicide region, wherein the CESL is in physical contact with the outer edge of the spacer.

2. The semiconductor device of claim 1, wherein the second thickness is less than about 65 percent of the first thickness.

3. The semiconductor device of claim 1, wherein the second thickness is less than about 100 Å.

4. The semiconductor device of claim 1, wherein the deep source/drain region is raised.

5. The semiconductor device of claim 3, wherein the second portion of the graded silicide region has a bottom surface higher than a top surface of the semiconductor substrate.

6. The semiconductor device of claim 3, wherein the second portion of the graded silicide region has a bottom surface lower than a top surface of the semiconductor substrate.

7. The semiconductor device of claim 1, wherein the first portion of the graded silicide region is laterally spaced apart from the LDD region.

8. The semiconductor device of claim 1, wherein the first portion of the graded silicide region has a thickness greater than a thickness of the LDD region.

9. A semiconductor device comprising:
  a semiconductor substrate;
  a gate stack overlying the semiconductor substrate;
  a lightly doped source/drain (LDD) region adjacent the gate stack;
  a deep source/drain region adjoining the LDD region;
  a graded silicide region on the deep source/drain region and the LDD region, wherein the graded silicide region comprises a first portion having a first thickness, a second portion adjoining the first portion and having a second thickness substantially less than the first thickness, wherein the second thickness is less than about 100 Å, and wherein the second portion is closer to a channel region than the first portion;
  a spacer on a sidewall of the gate stack, wherein the spacer is free from portions directly over the second portion of the graded silicide region, and wherein an inner edge of the second portion adjoins an outer edge of the spacer; and
  a contact etch stop layer (CESL) over the gate stack, the spacer, and the graded silicide region, wherein the CESL is in physical contact with the outer edge of the spacer.

10. The semiconductor device of claim 9, wherein the second portion of the graded silicide region has a bottom surface higher than a top surface of the semiconductor substrate.

11. The semiconductor device of claim 9, wherein the second portion of the graded silicide region has a bottom surface lower than a top surface of the semiconductor substrate.

12. The semiconductor device of claim 9, wherein the first portion of the graded silicide region is laterally spaced apart from the LDD region.

13. The semiconductor device of claim 9, wherein the first portion of the graded silicide region has a thickness greater than a thickness of the LDD region.

14. A semiconductor device comprising:
  a semiconductor substrate;
  a gate stack overlying the semiconductor substrate;
  a lightly doped source/drain (LDD) region adjacent the gate stack;
  a deep source/drain region adjoining the LDD region, the deep source/drain region being raised;
  a graded silicide region on the deep source/drain region and the LDD region, wherein the graded silicide region comprises a first portion having a first thickness, a second portion adjoining the first portion and having a second thickness substantially less than the first thickness, and wherein the second portion is closer to a channel region than the first portion;
  a spacer on a sidewall of the gate stack, wherein the spacer is free from portions directly over the second portion of the graded silicide region, and wherein an inner edge of the second portion adjoins an outer edge of the spacer; and
  a contact etch stop layer (CESL) over the gate stack, the spacer, and the graded silicide region, wherein the CESL is in physical contact with the outer edge of the spacer.

15. The semiconductor device of claim 14, wherein the spacer is a slim spacer having a thickness of less than about 200 Å.

16. The semiconductor device of claim 14, wherein the second thickness is less than about 100 Å.

17. The semiconductor device of claim 14, wherein the second portion of the graded silicide region has a bottom surface higher than a top surface of the semiconductor substrate.

18. The semiconductor device of claim 14, wherein the first portion of the graded silicide region is laterally spaced apart from the LDD region.

19. The semiconductor device of claim 14, wherein the first portion of the graded silicide region has a thickness greater than a thickness of the LDD region.

* * * * *